United States Patent
Sinha et al.

(10) Patent No.: US 7,929,314 B2
(45) Date of Patent: Apr. 19, 2011

(54) METHOD AND APPARATUS OF CHANGING PCB PAD STRUCTURE TO INCREASE SOLDER VOLUME AND STRENGTH

(75) Inventors: Arvind K. Sinha, Rochester, MN (US); Thomas S. Thompson, Lake City, MN (US)

(73) Assignee: International Business Machines Corporation, Armonk, NY (US)

(*) Notice: Subject to any disclaimer, the term of this patent is extended or adjusted under 35 U.S.C. 154(b) by 393 days.

(21) Appl. No.: 12/143,540

(22) Filed: Jun. 20, 2008

(65) Prior Publication Data
US 2009/0316376 A1 Dec. 24, 2009

(51) Int. Cl.
*H01R 9/00* (2006.01)
(52) U.S. Cl. ........... 361/772; 361/749; 361/760; 174/263; 174/267; 29/843
(58) Field of Classification Search ......... 361/770–774, 361/749, 760; 174/262–268; 29/843, 830, 29/842, 874, 884, 857; 257/600–780; 438/1; 428/1
See application file for complete search history.

(56) References Cited

U.S. PATENT DOCUMENTS

| 5,573,172 | A | 11/1996 | Gore |
| 5,869,887 | A * | 2/1999 | Urushima .................... 257/684 |
| 6,623,283 | B1 | 9/2003 | Torigian et al. |
| 6,983,536 | B2 * | 1/2006 | Farnworth et al. ............ 29/833 |
| 7,013,564 | B2 * | 3/2006 | Shimokawa et al. .......... 29/854 |
| 7,087,846 | B2 * | 8/2006 | Alcoe ......................... 174/267 |
| 2007/0045812 | A1 * | 3/2007 | Heng ......................... 257/693 |
| 2008/0036079 | A1 | 2/2008 | Chen et al. |

FOREIGN PATENT DOCUMENTS

JP 2007294916 11/2007

* cited by examiner

*Primary Examiner*—Xiaoliang Chen
(74) *Attorney, Agent, or Firm*—Suiter Swantz pc llo

(57) ABSTRACT

The present disclosure is directed at an apparatus for changing printed circuit board pad structure to increase solder volume and strength. The invention provides increased end row pad and lead size and utilizes a plurality of lead-to-pad and pad-to-lead conforming geometric structures to form a joint providing additional solder surface adhesion area.

2 Claims, 7 Drawing Sheets

*Current POR Pad Dimensions for ALL Ground Pads*

*New Pad Dimension for A & P Ground Pads*

US 7,929,314 B2

METHOD AND APPARATUS OF CHANGING PCB PAD STRUCTURE TO INCREASE SOLDER VOLUME AND STRENGTH

TECHNICAL FIELD

The present disclosure generally relates to the field of printed circuit board (PCB) structures and more particularly to a method for using different geometries to increase solder volume on PCB structures.

BACKGROUND

Component assembly misalignment to printed circuit boards is a troublesome problem in the electronic arts. As components get smaller and circuit board component density increases, the likelihood of misalignment occurring increases. Additionally, due to assembly misalignment of node actuation and reflow conditions, the solder fillet formed at the interface of pads and signal/ground leads can produce connections low in solder volume with thinner bondlines. These conditions increase manufacturing cost and waste.

SUMMARY

The present disclosure is directed at an improved method and apparatus for changing printed circuit board pad structure to increase solder volume and the strength of printed circuit board lead connections. The improvement including, but not limited to, a plurality of printed circuit board pads, a plurality of ground leads with associated connection pads, a plurality of signal leads with associated connection pads, a flat surface interface on the printed circuit board pads, ground lead pads, and signal lead pads acting as the connection surface between the printed circuit board pads and the ground and signal lead pads, the plurality of ground leads and the plurality of signal leads with associated pads and the plurality of printed circuit board pads oriented on a printed circuit board comprising inner rows and a singular end row, the singular end row of lead pads and printed circuit board pads, at least one of which is sized to 1.25 mm by 0.58 mm, the flat surface interface including: a plurality of raised 1 mil bumps on the printed circuit board pads corresponding to 1 mil indentations on the signal and ground lead pads, a plurality of raised 1 mil bumps on the signal and ground lead pads corresponding to 1 mil indentations on the printed circuit board pads, a plurality of raised 1 mil ovals on the printed circuit board pads oriented longitudinally to the length of the pad corresponding to indentations on the signal lead pads, and a plurality of raised 1 mil ovals on the printed circuit board pads oriented laterally to the length of the pad corresponding to indentations on the signal lead pads.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
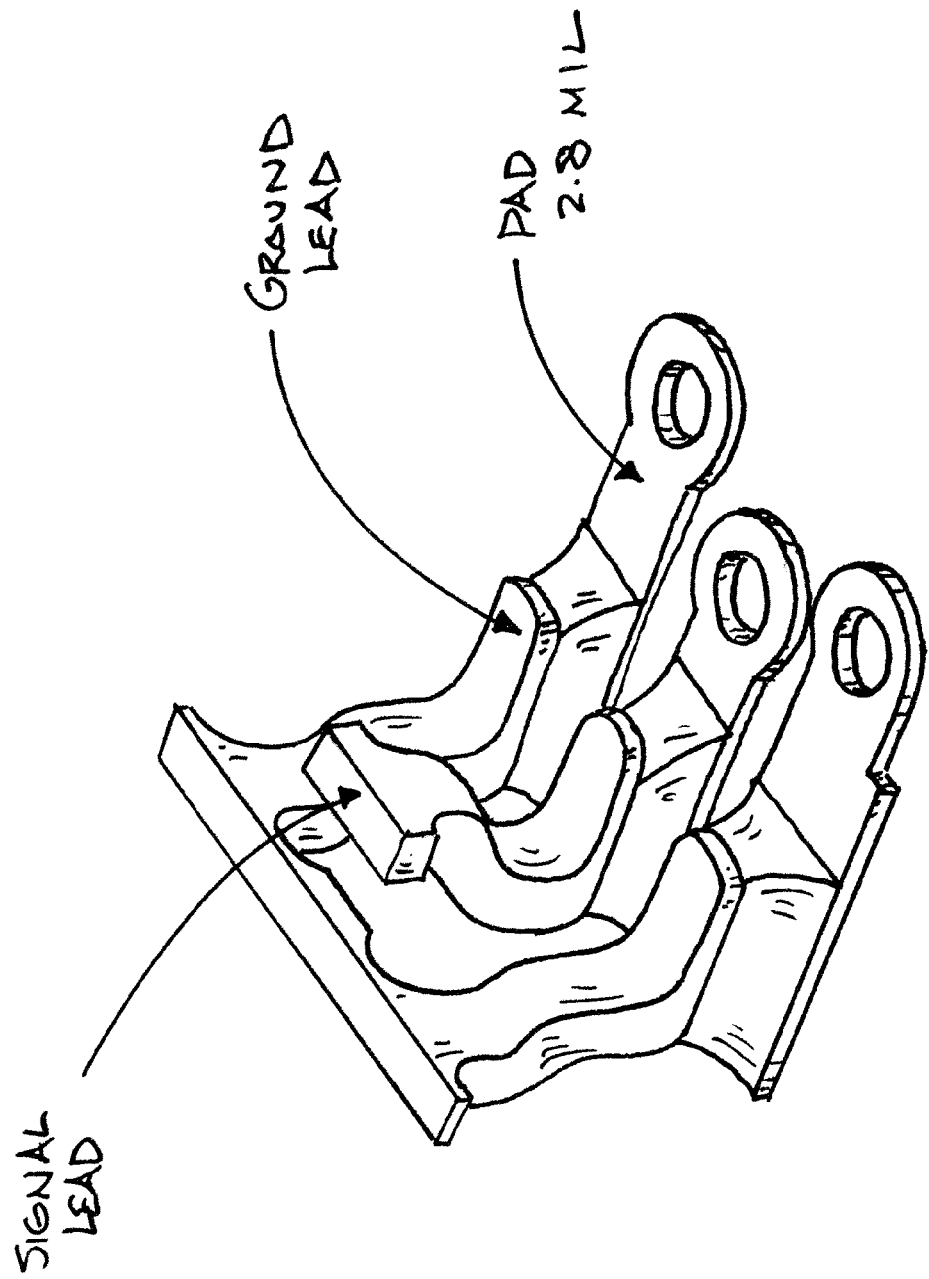
FIG. 1 shows a first embodiment of the singular end row of lead pads and printed circuit board pads (preferably sized to 1.25 mm by 0.58 mm) for reducing tension on outer leads without changing inner row pads.
Figure 2:
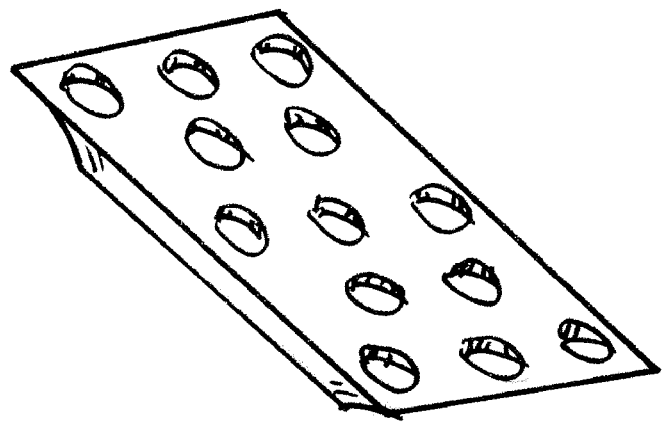
FIG. 2 shows an embodiment of a plurality of raised 1 mil bumps on printed circuit board pads corresponding to 1 mil indentations on the signal and ground lead pads to increase solder volume and structural support while providing a flat surface interface which reduces tensile stress on both signal and ground leads.
Figure 2:
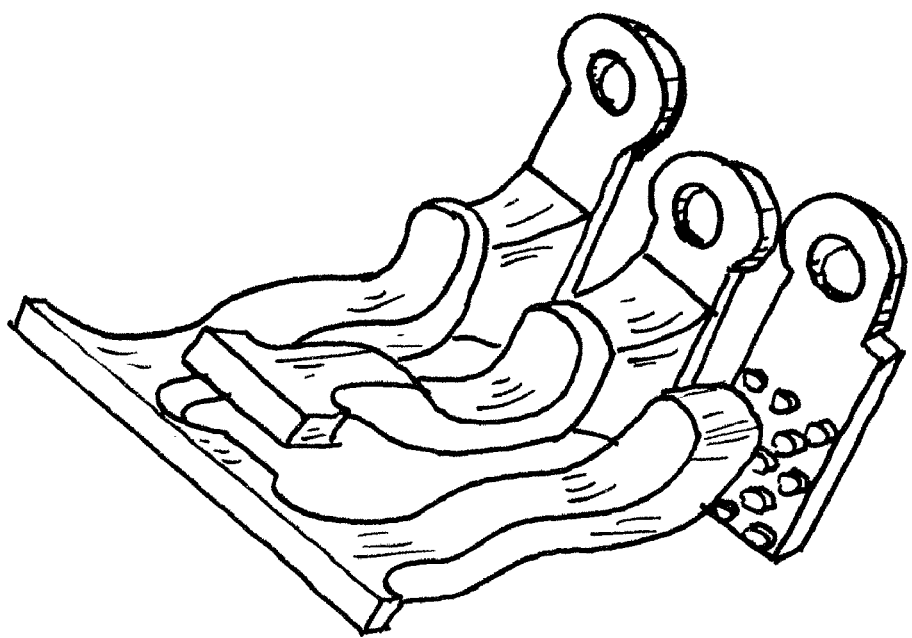
Figure 3:
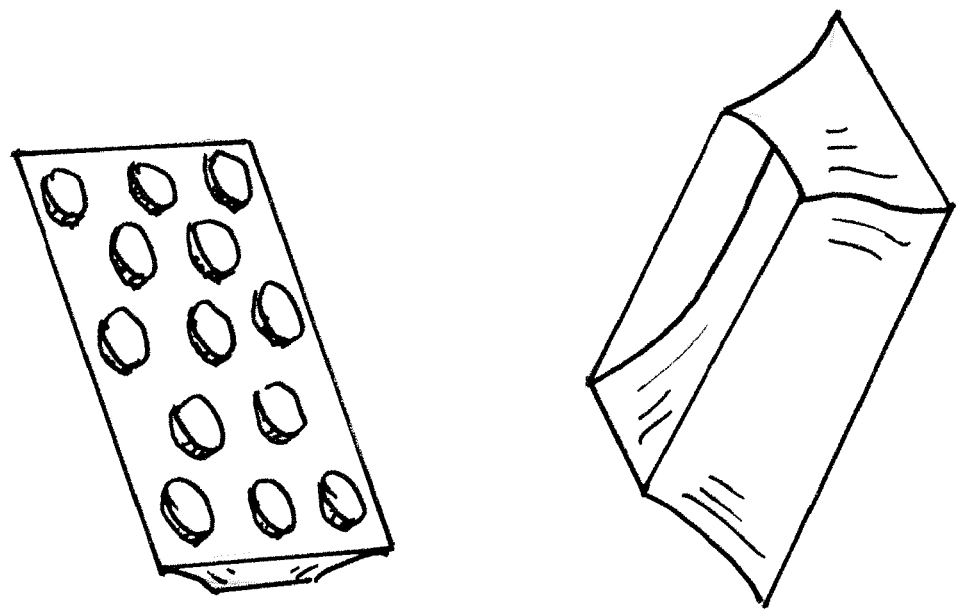
FIG. 3 shows an additional embodiment of FIG. 2, wherein indentations operably engage bumps (rather than bumps operably engage indentations) are placed on the printed circuit board pad.
Figure 3:
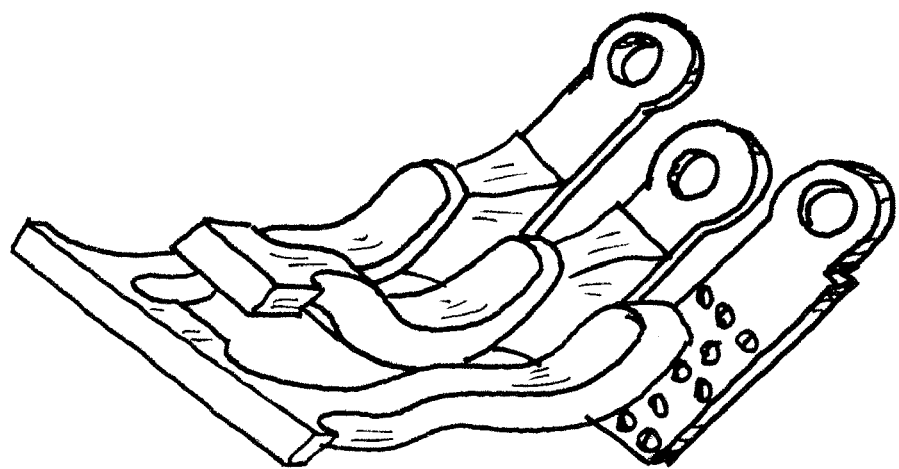
Figure 4:
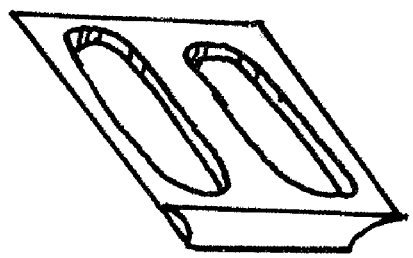
FIG. 4 shows an embodiment of a plurality of raised 1 mil ovals on the printed circuit board pads oriented longitudinally to the length of the pad corresponding to indentations on the signal and ground lead pads to increase solder volume and structural support while providing a flat surface interface which reduces tensile stress on both signal and ground leads.
Figure 4:
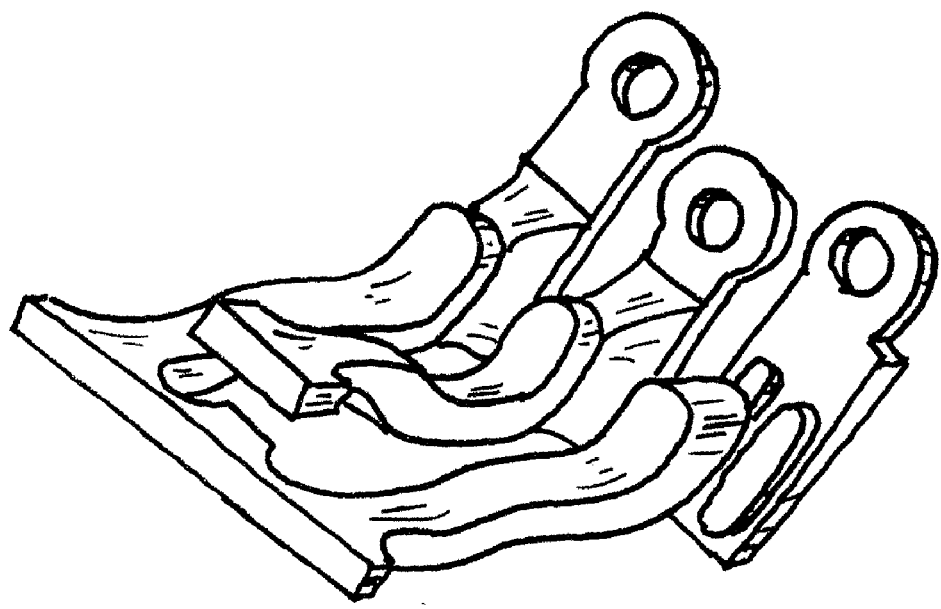
Figure 5:
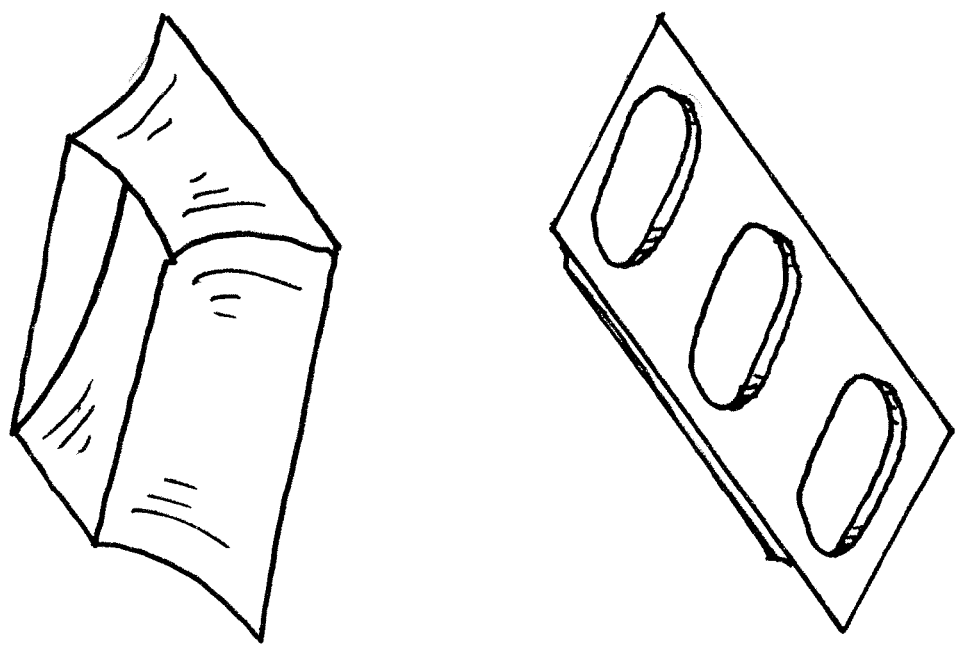
FIG. 5 shows an embodiment of a plurality of raised 1 mil ovals on the printed circuit board pads oriented laterally to the length of the pad corresponding to indentations on the signal and ground lead pads to increase solder volume and structural support while providing a flat surface interface which reduces tensile stress on both signal and ground leads.
Figure 5:
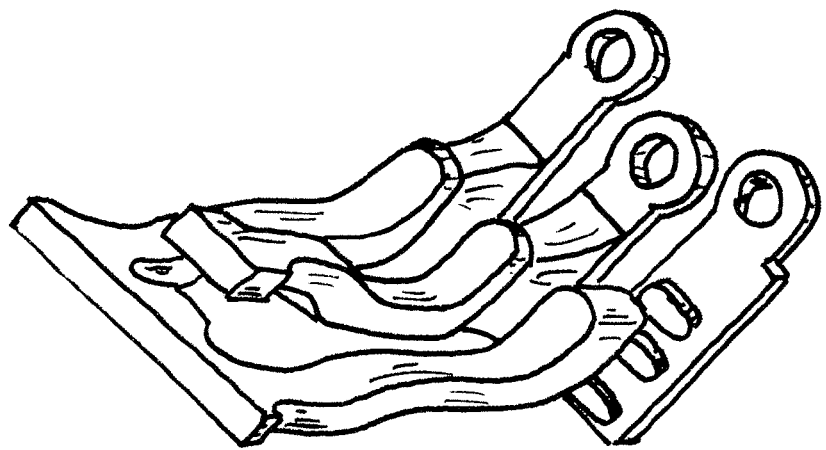
Figure 6:
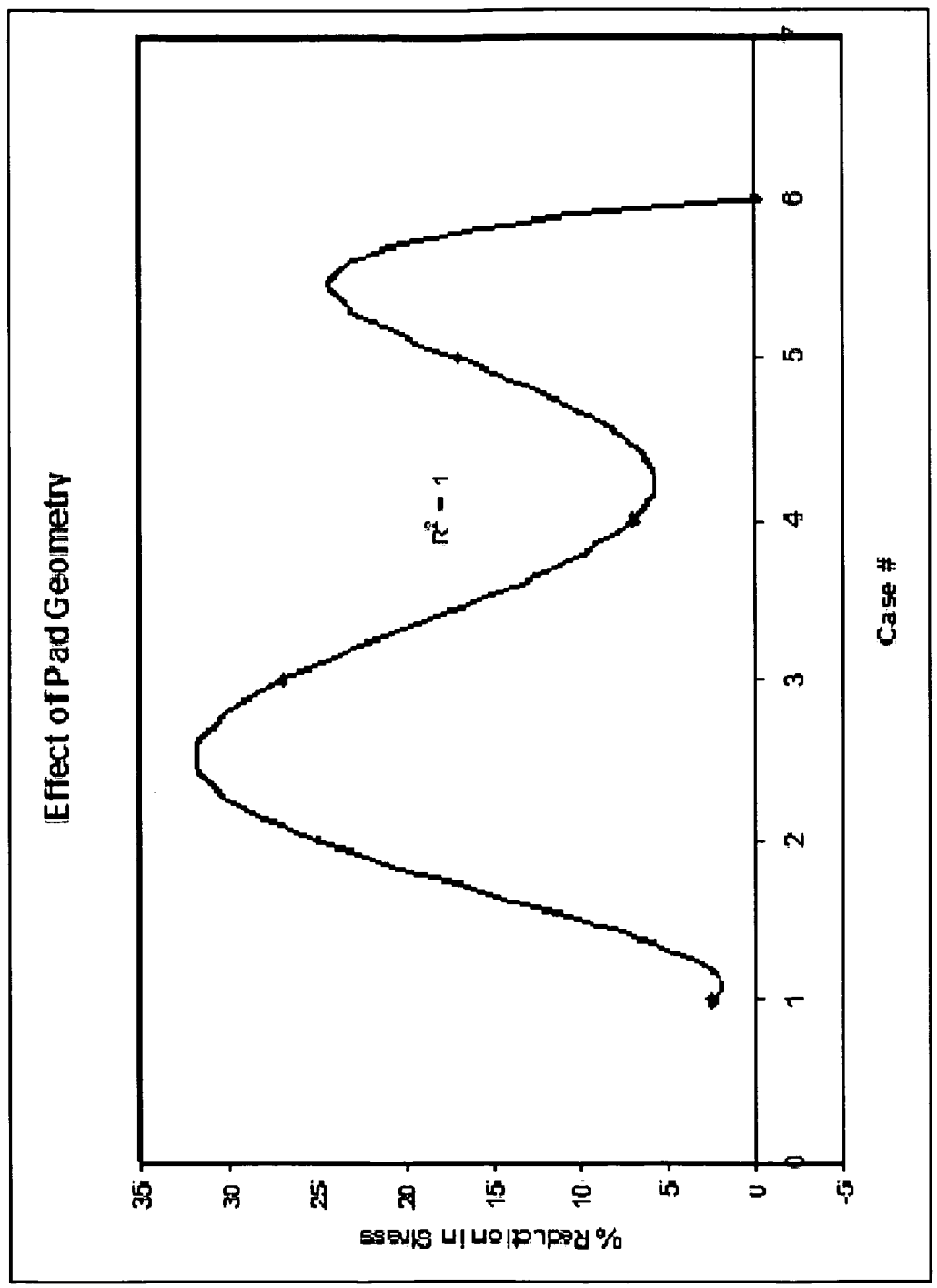
FIG. 6 shows results of finite element models illustrating signal lead tensile strength improvement.
Figure 7:
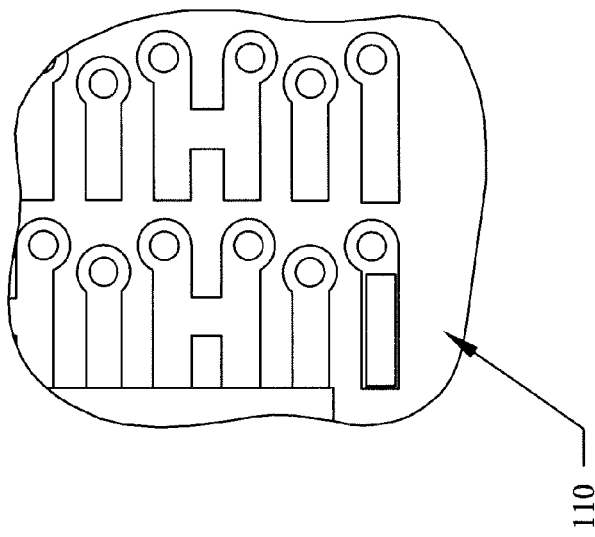
FIG. 7 shows an embodiment of the increased pad dimensions of the singular end row pads (shaded).
Figure 7:
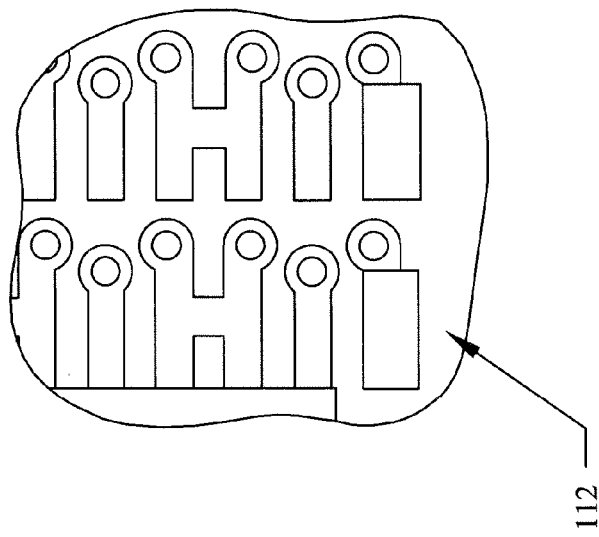

The present disclosure is directed to an apparatus, constructed from the method of a preferred embodiment of the present invention, for increasing solder volume and strength on the flat surface interface between signal and ground lead pads and printed circuit board pads. Referring to FIG. 1, shown is an embodiment of the apparatus of the singular end rows sized to 1.25 mm by 0.58 mm. FIG. 2 and FIG. 3 detail the apparatus of increased singular end row size in addition to raised 1 mil bumps on the printed circuit board pads corresponding to indentations on the signal and ground lead pads, the opposite is shown in FIG. 3 with indentations on the printed circuit board pads and raised 1 mil bumps on the signal or ground lead pads. FIG. 4 and FIG. 5 detail the oval shaped raised bars on the signal and ground lead pads oriented longitudinally with the length of the pad, (FIG. 4), or laterally to the length of the pad (FIG. 5). FIG. 7 illustrates the increased size of the outer row in a currently preferred embodiment 112 (1.25 mm×0.58 mm) over the prior art 110 (1.25 mm×0.40 mm).

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

The invention claimed is:

1. An improved printed circuit board pad and lead connection apparatus for providing increased solder volume and strength, comprising:
   a plurality of printed circuit board pads;
   a plurality of ground leads with associated connection pads;
   a plurality of signal leads with associated connection pads;
   a flat surface interface on the printed circuit board pads, ground lead pads, and signal lead pads acting as the connection surface between the printed circuit board pads and the ground and signal lead pads;
   the plurality of ground leads and the plurality of signal leads with associated pads and the plurality of printed circuit board pads oriented on a printed circuit board comprising inner rows and a singular end row;
   the singular end row of lead pads and printed circuit board pads, at least one of which is sized to 1.25 mm by 0.58 mm;
   the flat surface interface including:
   a plurality of raised 1 mil bumps on the printed circuit board pads corresponding to 1 mil indentations on the signal and ground lead pads;
   a plurality of raised 1 mil bumps on the signal and ground lead pads corresponding to 1 mil indentations on the printed circuit board pads;
   a plurality of raised 1 mil ovals on the printed circuit board pads oriented longitudinally to the length of the pad corresponding to indentations on the signal lead pads; and
   a plurality of raised 1 mil ovals on the printed circuit board pads oriented laterally to the length of the pad corresponding to indentations on the signal lead pads.

2. A method for increasing solder volume and strength between leads and pads on a printed circuit board, comprising:
   providing a plurality of printed circuit board pads having at least one of a plurality of raised geometric structures and a plurality of indented geometric structures, said raised and indented geometric structures operably sized and configured to form a mechanical joint;
   providing a plurality of signal leads and ground leads, said signal leads and ground leads having associated connection pads, said connection pads having at least one of a plurality of raised geometric structures and a plurality of indented geometric structures, said raised and indented geometric structures operably sized and configured to form a mechanical joint with said printed circuit board pads;
   orientating said plurality of ground leads and signal leads on a printed circuit board comprising inner rows and a singular end row; and
   sizing said singular end row of lead pads and printed circuit board pads larger than said inner row of pads.

* * * * *